United States Patent
Kim

(10) Patent No.: US 7,939,228 B2
(45) Date of Patent: May 10, 2011

(54) EXTREME ULTRA VIOLET LITHOGRAPHY MASK AND METHOD FOR FABRICATING THE SAME

(75) Inventor: Yong Dae Kim, Cheonan-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 268 days.

(21) Appl. No.: 12/165,395

(22) Filed: Jun. 30, 2008

(65) Prior Publication Data

US 2009/0263730 A1    Oct. 22, 2009

(30) Foreign Application Priority Data

Apr. 22, 2008   (KR) .................. 10-2008-0037404

(51) Int. Cl.
*G03F 1/00* (2006.01)
(52) U.S. Cl. ........................................... 430/5

(58) Field of Classification Search .............. 430/5, 322, 430/323, 324, 394; 378/35
See application file for complete search history.

(56) References Cited

U.S. PATENT DOCUMENTS

| 6,013,399 | A  | * | 1/2000 | Nguyen ........................ 430/5 |
| 6,724,462 | B1 |   | 4/2004 | Singh et al. |
| 6,780,496 | B2 |   | 8/2004 | Bajt et al. |

FOREIGN PATENT DOCUMENTS

WO    WO 07/063021 A1    6/2007

* cited by examiner

*Primary Examiner* — Stephen Rosasco
(74) *Attorney, Agent, or Firm* — Kilpatrick Townsend & Stockton LLP

(57) ABSTRACT

A method for fabricating an extreme ultra violet lithography mask includes forming a reflective layer that reflects an extreme ultra violet light on a substrate; forming a capping layer that transmits the extreme ultra violet light on the reflective layer; and forming selectively pores in some region of the capping layer to form a light absorption region that absorbs the extreme ultra violet light.

13 Claims, 5 Drawing Sheets

EXTREME ULTRA VIOLET LITHOGRAPHY MASK AND METHOD FOR FABRICATING THE SAME

CROSS-REFERENCE TO RELATED APPLICATIONS

The present application claims priority to Korean patent application number 10-2008-0037404, filed on Apr. 22, 2008, which is incorporated by reference in its entirety.

BACKGROUND OF THE INVENTION

The present invention relates to a photomask for a semiconductor device, and more particularly, to an extreme ultra violet lithography mask and a method for fabricating the same.

As a degree of integration of a semiconductor device is increased and a design rule is reduced, a pattern size required in the device has rapidly decreased. This has driven photolithography equipment to use shorter and shorter wavelengths of light in the exposure process to get smaller feature sizes. However, the wavelength of light and an aperture number (NA) of the exposure apparatus shows a limitation. Accordingly, resolution enhancement technologies (RET), for example an immersion lithography, a double patterning technology, an extreme ultra violet (EUV) lithography, etc. have been suggested to overcome the resolution limit.

Particularly, to form a pattern having a critical dimension of less than 32 nm, a study for developing the extreme ultra violet lithography using an extreme ultra violet of 13.5 nm that is shorter than a wavelength of KrF or ArF has been continued. The EUV lithography process uses a mask comprising a reflective layer with a pattern on it (i.e., an extreme ultra violet mask). An EUV light is projected onto the mask and then the pattern on the mask is transferred onto a wafer. An extreme ultra violet mask has a light reflective structure, for example, a reflective layer including a multi-layer of a molybdenum (Mo) layer and a silicon (Si) layer. An EUV mask also has a capping layer, a buffer layer pattern and an absorption layer pattern formed on top of the light reflective structure. When the EUV light is irradiated onto the EUV mask, the light is absorbed by the absorption layer pattern (i.e., mask pattern) and reflected by a surface of the reflective layer exposed by the absorption layer pattern.

However, the EUV light irradiated onto the EUV mask is irradiated or reflected at an inclined incidence angle, e.g. an angle of 5 to 6° from perpendicular to the surface. With this angle a shadow may be exhibited due to a height difference between an upper surface of the absorption layer pattern and a surface of the reflective layer. This shadow effect can change the critical dimension of a wafer pattern.

SUMMARY OF THE INVENTION

In one embodiment, a method for fabricating an extreme ultra violet lithography mask includes: forming a reflective layer that reflects an extreme ultra violet light on a substrate; forming a capping layer that transmits the extreme ultra violet light on the reflective layer; and forming selectively pores in some region of the capping layer to form a light absorption region that absorbs the extreme ultra violet light by the pores.

The reflective layer may be formed in such a manner that double layers of a molybdenum layer and a silicon layer are repeatedly stacked. The capping layer may be formed including a silicon layer.

The light absorption region may include: forming a hard mask film pattern that exposes some portion of the silicon layer on the silicon layer; treating the portion of the silicon layer exposed by the hard mask film pattern with a chemical solution including an oxidation agent and an etchant to lead formation of pores in the portion of the silicon layer; and removing the hard mask film pattern.

The chemical solution may further include a diluent, in which the oxidation agent includes nitric acid solution, the etchant includes hydrofluoric acid solution and the diluent includes pure water. At this time, a volume ratio of the nitric acid solution and the hydrofluoric acid solution may be 49:1 to 50:1.

The chemical solution may further include a diluent and ethanol solution, in which the oxidation agent includes nitric acid solution, the etchant includes hydrofluoric acid solution and the diluent includes pure water. At this time, a volume ratio of the nitric acid solution and the hydrofluoric acid solution may be 49:1 to 50:1 and a volume ratio of the hydrofluoric acid solution and the ethanol solution may be 10:1 to 5:1.

In another embodiment, an extreme ultra violet lithography mask includes: a substrate; a reflective layer formed on the substrate and reflecting an extreme ultra violet light; and a capping layer on the reflective layer including a light transmittance region that transmits the incident extreme ultra violet light and a light absorption region that absorbs the incident extreme ultra violet light by pores.

The reflective layer may be formed in such a manner that double layers of a molybdenum layer and a silicon layer are repeatedly stacked. The capping layer may be formed of a silicon layer.

DESCRIPTION OF SPECIFIC EMBODIMENTS

Hereinafter, a method for fabricating a photomask in accordance with the present invention will be described in detail with reference to the accompanying drawings.

Figure 1:
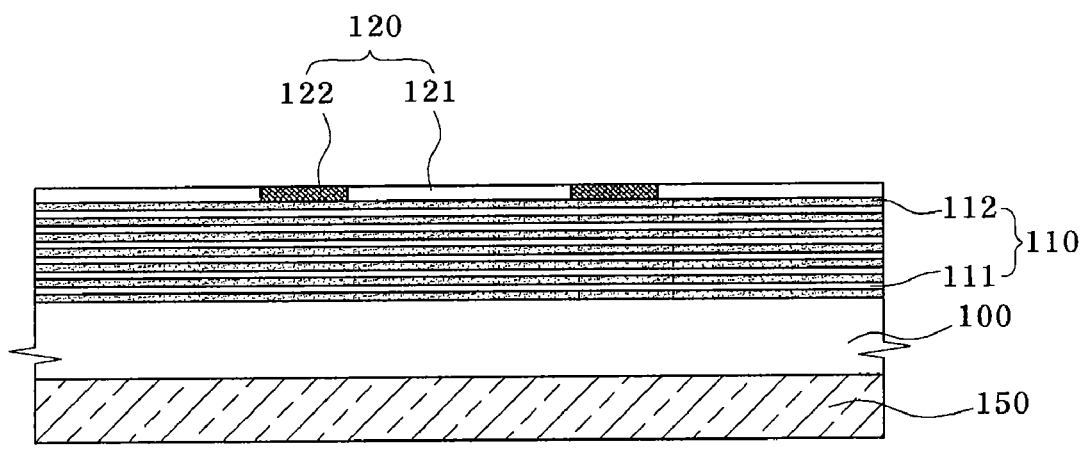
FIG. 1 illustrates a cross-sectional view of an extreme ultra violet lithography mask according to an embodiment of the present invention.

Referring to FIG. 1, an extreme ultra violet lithography mask includes a substrate 100, a reflective layer 110 on the substrate 100 that reflects a extreme ultra violet light, and a capping layer 120 on the reflective layer 110. The capping layer 120 includes a light transmittance region 121 through which the incident extreme ultra violet light is transmitted and a light absorption region 122 in which the incident extreme ultra violet light is absorbed. The EUV lithography mask may further include a chrome nitride (CrN) film 150 formed on a back side of the substrate 100.

The substrate 100 may formed of quartz having a low thermal expansion coefficient. In the reflective layer 110, alternating layers of a molybdenum (Mo) layer 111 and a silicon (Si) layer 112 are repeatedly stacked so as to reflect the extreme ultra violet light (13.5 nm) irradiated onto the mask. At this time, the molybdenum layer 111 acts to reflect the extreme ultra violet light not absorbed by the extreme ultra violet lithography mask, and the extreme ultra violet light is reflected by the molybdenum layer 111 and the silicon layer 112 according to Bragg reflection principle.

The capping layer 120 may include a silicon layer. The capping layer 120 acts to selectively transmit or absorb the extreme ultra violet light irradiated onto the mask according to whether pores are present or not. The capping layer 120 also protects the reflective layer 110 from restraining undesirable oxidation and contamination. For example, the light transmittance region 121 is the portion in which the pores are not formed, and the light absorption region 122 is the porous portion in which the pores are formed.

When the extreme ultra violet light is irradiated with the inclined incidence angle onto the extreme ultra violet lithography mask, the extreme ultra violet light irradiated onto the light absorption region 122 of the capping layer 120 is absorbed by the pores. The light transmittance region 121 transmits the extreme ultra violet light and the transmitted extreme ultra violet light is reflected by the reflective layer 110. Then the reflected extreme ultra violet light is retransmitted through the light transmittance region 121 and delivered to the wafer.

The extreme ultra violet mask according to an embodiment of the present invention has a structure where the light absorption region and the light transmittance region are created on the same plane. This eliminates the need for having a layer between the light absorption region and the reflective layer (i.e., The absorption layer sits directly on top of the reflective layer in the present embodiment). Therefore, it is possible to reduce the shadow phenomenon resulting from the height difference between the surfaces of the reflective layer and the absorption layer when the extreme ultra violet light is irradiated onto the extreme ultra violet lithography mask.

Figure 2:
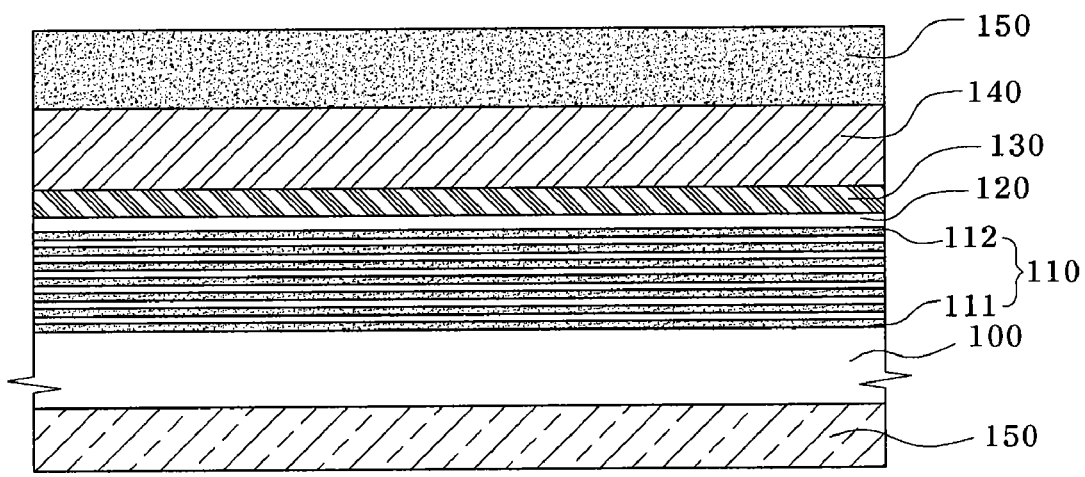
FIGS. 2 to 5 illustrate a process of fabricating an extreme ultra violet lithography mask according to an embodiment of the present invention.

A method for fabricating the extreme ultra violet lithography mask according to an embodiment of the present invention will be described. Referring to FIG. 2, the reflective layer 110 that reflects the extreme ultra violet light, the capping layer 120 that transmits the extreme ultra violet light, a buffer layer 130, a hard mask film 140 and a resist film 150 are formed on the substrate 100.

The substrate 100 may be formed from quartz having a low thermal expansion coefficient. The reflective layer 110 may be formed to a thickness which can reflect the extreme ultra violet light (13.5 nm) irradiated onto the mask, for example, by repeatedly stacking about 40 to 50 layers of a stacked structure of a molybdenum layer 111 and silicon layer 112.

The capping layer 120 may be formed from a silicon layer. In a subsequent process a porous region will be formed in the capping layer 120. The capping layer 120 will be divided into the light transmittance region which transmits the extreme ultra violet light and the light absorption region which is formed with the pores and absorbs the extreme ultra violet light. The capping layer 120 also acts to protect the reflective layer 110 by restraining the undesirable oxidation or contamination of the reflective layer 110 and to prevent the reflective layer 110 from being attacked during a subsequent patterning of the hard mask film. If the capping layer 120 is formed using a silicon layer, the hard mask film 140 may be formed from a group including a tantalum boron nitride (TaBN) film and a tantalum boron oxide (TaBO) film. The buffer layer 130 may be formed of a chrome nitride (CrN) or silicon oxide ($SiO_2$) film.

At this time, a chrome nitride (CrN) film 150 may be formed on the back side of the substrate on which the reflective layer 110, the capping layer 120, the hard mask film 140 and the resist film 150 are formed. The CrN film 150 allows mounting of the mask onto the EUV lithography equipment using electrostatic force.

Figure 3:
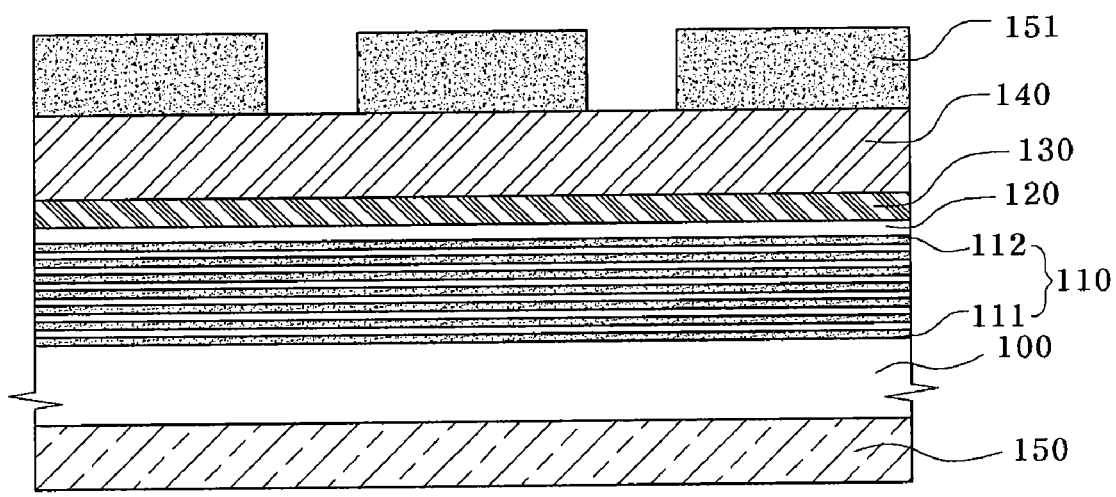

Referring to FIG. 3, a lithography process is performed to form a resist pattern 151 that selectively exposes the hard mask film 140. Specifically, the resist film is exposed to a patterned light source to perform an exposure process. A development process using a developing solution is performed to the resist film. The resist pattern 151 is formed so that the light absorption region to be subsequently formed can be exposed.

Figure 4:
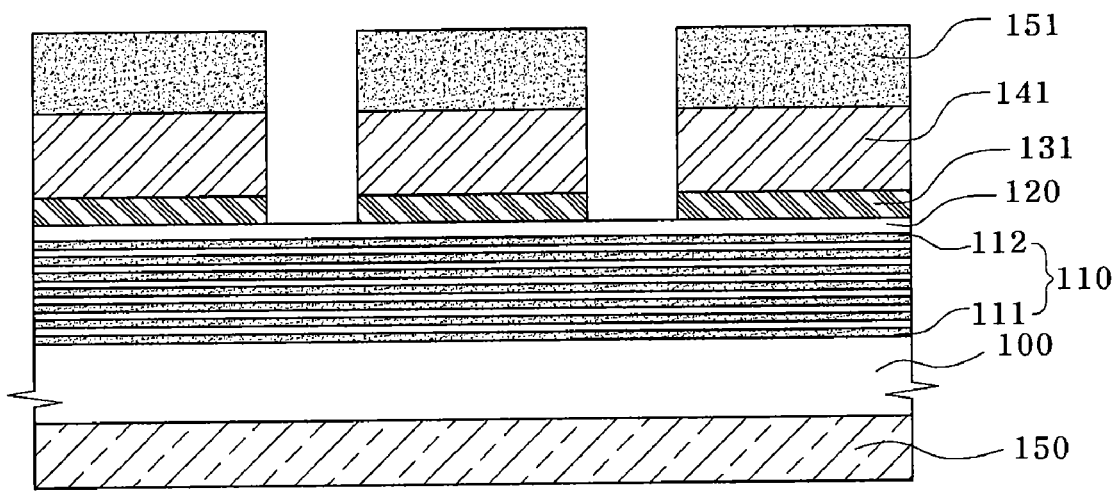

Referring to FIG. 4, the resist pattern 151 is used as a hard mask to etch the hard mask film 140 and the buffer layer 130 to form a hard mask film pattern 141 and a buffer film pattern 131, respectively. This selectively exposes the capping layer 120. The exposed region will become the absorption region in the capping layer 120 and the portion of the capping layer 120 that is blocked by the hard mask film pattern 141 is the portion to be used as the light transmittance region.

Figure 5:
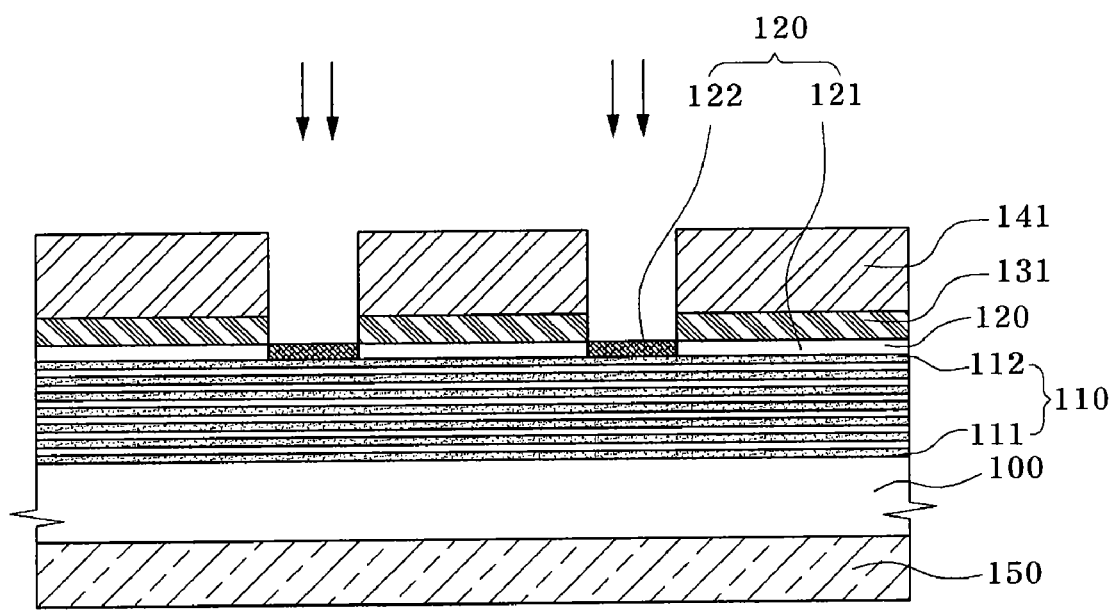

Referring to FIG. 5, after the resist pattern (141 in FIG. 4) is removed, the portion of the capping layer 120 that is exposed by the hard mask film layer 141 is treated with a chemical solution in which nitric acid ($HNO_3$) solution, hydrofluoric (HF) acid solution and deionized water DIW are mixed. At this time, the nitric acid solution is used as an oxidation agent and the hydrofluoric acid solution is used as an etchant. Then, the silicon (Si) in the capping layer 120 exposed by the hard mask film pattern 141 and the nitric acid solution react to form silicon oxide. Then the silicon oxide is etched while the silicon oxide and the hydrofluoric acid solution react. As a result, the exposed capping layer 120 is made porous, thereby having porosity. The volume ratio of the nitric acid solution and the hydrofluoric acid solution can be 49:1 to 50:1.

The capping layer 120 exposed by the hard mask film layer 141 may also be treated with a chemical solution, in which nitric acid ($HNO_3$) solution, hydrofluoric (HF) acid solution, an ethanol ($CH_3CH_2OH$) solution and DIW are mixed. The volume ratio of the nitric acid solution and the hydrofluoric acid solution can be 49:1 to 50:1 and a volume ratio of the hydrofluoric acid solution and the ethanol solution can be 10:1 to 5:1. Herein, the ethanol solution acts to control size and density of the pores formed within the capping layer 120.

For example, in the portion of the capping layer 120 formed with the pores, e.g. the light absorption region 122, scattered reflection of the extreme ultra violet light is generated due to the pores and the extreme ultra violet light is canceled out and absorbed between the pores when the extreme ultra violet light is irradiated onto the mask. The absorptance of the extreme ultra violet light is influenced by the size and density of the pores formed in the light absorption region 122. However, the size and density of the pores can be controlled by the volume ratio of the nitric acid solution, hydrofluoric acid solution and an ethanol solution, and so it is possible to control the light absorptance of the extreme ultra violet light.

The hard mask film pattern and buffer film pattern (131 and 141 in FIG. 5) are removed. Then, the capping layer 120 including the light transmittance region 121 that selectively transmits the extreme ultra violet light and the light absorption region 122 that absorbs the extreme ultra violet light is exposed, thereby forming the extreme ultra violet lithography mask having the structure suggested in FIG. 1.

According to an embodiment of the present invention, by selectively forming the pores in a region of the capping layer, it is possible to divide the capping layer into the light absorption region that absorbs the extreme ultra violet light and the light transmittance region that transmits the extreme ultra violet light and thus utilize one layer for both purposes. Also, it is possible to restrain the shadow effect caused by the large height difference between the buffer layer pattern and the absorption layer pattern, and thus to prevent the shift phenomenon in which a location of a wafer pattern is changed.

Figure 6:
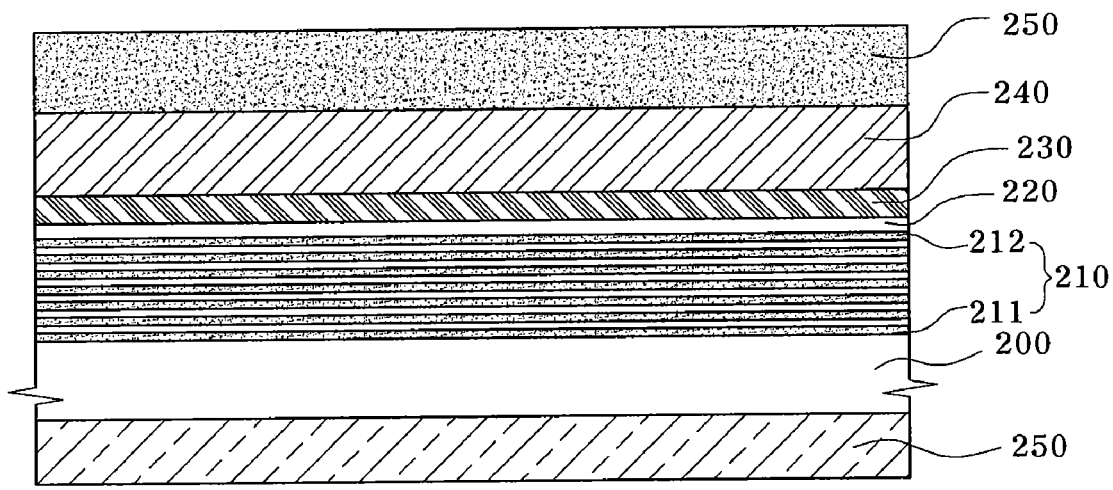
FIGS. 6 to 10 illustrate a process of fabricating an extreme ultra violet lithography mask according to another embodiment of the present invention.

Herein after, a method for fabricating the extreme ultra violet lithography mask according to another embodiment of the present invention will be described. Referring to FIG. 6, the reflective layer 210 that reflects the extreme ultra violet light, the capping layer 220 that transmits the extreme ultra violet light, the buffer layer 230, the hard mask film 240 and the resist film are formed on the substrate 200.

The substrate 200 may be formed using quartz having a low thermal expansion coefficient. The reflective layer 210 may be formed to a thickness that can reflect the extreme ultra violet light (13.5 nm) irradiated onto the mask, for example, by repeatedly stacking about 40 to 50 layers of a stacked structure of a molybdenum layer 211 and silicon layer 212.

The capping layer 220 may be formed with a silicon layer. The capping layer 120 protects the reflective layer 210 from undesirable oxidation or contamination and to prevent the reflective layer 210 from being attacked during a subsequent patterning of the hard mask film. If the capping layer 220 is formed with a silicon layer, the hard mask film 240 may be formed from a group including a tantalum boron nitride (TaBN) film and a tantalum boron oxide (TaBO) film. The buffer layer 230 may be formed of a chrome nitride (CrN) or silicon oxide ($SiO_2$) film.

At this time, a chrome nitride (CrN) film 250 may be formed on the back side of the substrate on which the reflective layer 210, the capping layer 220, the hard mask film 240 and the resist film 250 are formed. The CrN film 250 allows mounting of the mask onto extreme ultra violet lithography equipment using electrostatic force.

Figure 7:
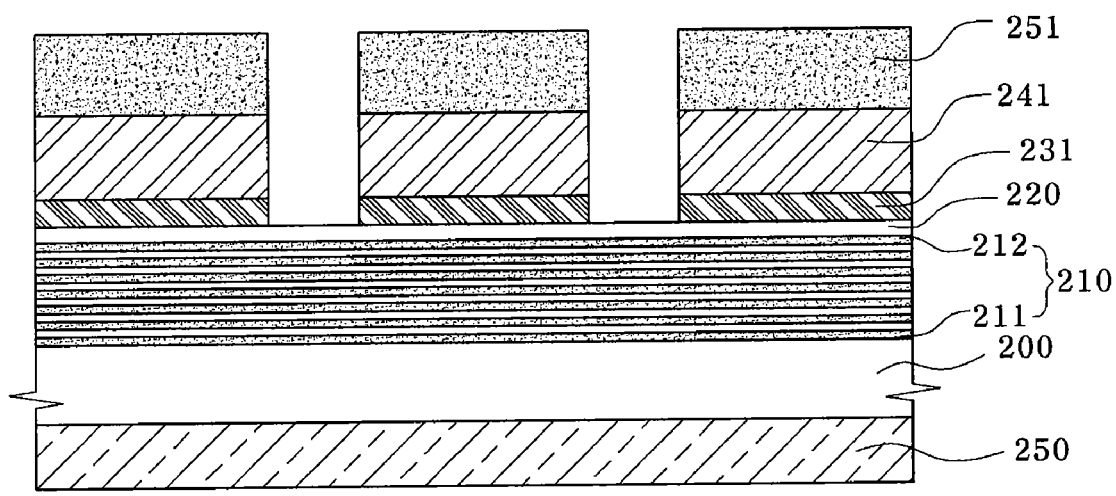

Referring to FIG. 7, a lithography process is performed to form a resist pattern 251 that selectively exposes the hard mask film 240. Specifically, the resist film is exposed to a patterned light source to perform an exposure process. A development process using a developing solution is performed on the resist film. The resist pattern 251 is formed so that the light absorption region to be subsequently formed is exposed.

Next, the resist pattern 251 is used as a hard mask to etch the hard mask film 240 and the buffer layer 230 to form a hard mask film pattern 241 and buffer film pattern, respectively. This selectively exposes the capping layer 220. The exposed region will become the absorption region in the capping layer 220 and the portions of the capping layer 220 blocked by the hard mask film pattern 241 is used as the light transmittance region.

Figure 8:
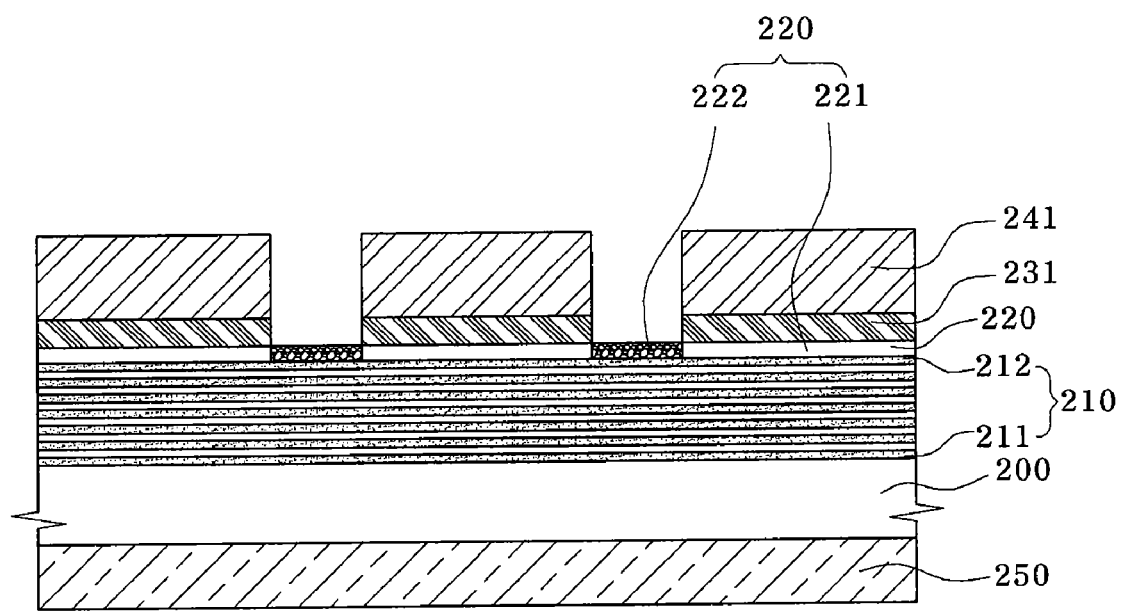

Referring to FIG. 8, after the resist pattern (241 in FIG. 7) is removed, a laser beam with a long wavelength is irradiated to the portion of the capping layer 220 that is exposed by the buffer film pattern 231 and the hard mask film pattern 241, thereby changing the lattice structure of the silicon from a regular structure to an irregular structure. At this time, a laser having a long wavelength with a frequency in the unit of pico second, for example, 650 nm wavelength may be used.

Specifically, the laser beam using a long wavelength as a light source is irradiated onto the portion of the capping layer 230 exposed by the hard mask film pattern. Then, bonding of the silicon atoms are broken due to laser beam energy at the point to which the laser beam is focused. The irregular structure created by the laser becomes the light absorption region 222 that absorbs the extreme ultra violet light. For example, when the extreme ultra violet light is irradiated into the portion of the capping layer with the irregular structure, the extreme ultra violet light is canceled out and absorbed between the irregular lattice structure, thereby acting similarly to the light absorption pattern.

Meanwhile, by controlling the point to which the laser beam is focused, it is possible to change the lattice structure of the silicon layer 211 included in the reflective layer 210, as well as the capping layer 230, into the irregular structure. The reflective layer 210 is formed in a structure where alternating layers of a molybdenum layer 211 and a silicon layer 212 are repeatedly stacked. Since the reflective layer 210 does not reflect a long wavelength laser beam when the long wavelength laser beam is irradiated into the reflective layer, it is possible to change the lattice structure of the silicon layer 212 included in the reflective layer 210 into the irregular structure by controlling the focus point of the laser beam. Therefore, when the extreme ultra violet light is irradiated onto the portions of the capping layer and reflective layer of which the lattice structures are changed into the irregular structure, the extreme ultra violet light is canceled out and absorbed between the irregular lattice structures. Consequently, it is possible to selectively form portions of the capping layer 220 and the reflective layer 210 into the light absorption region 260 that absorbs the extreme ultra violet light.

Figure 9:
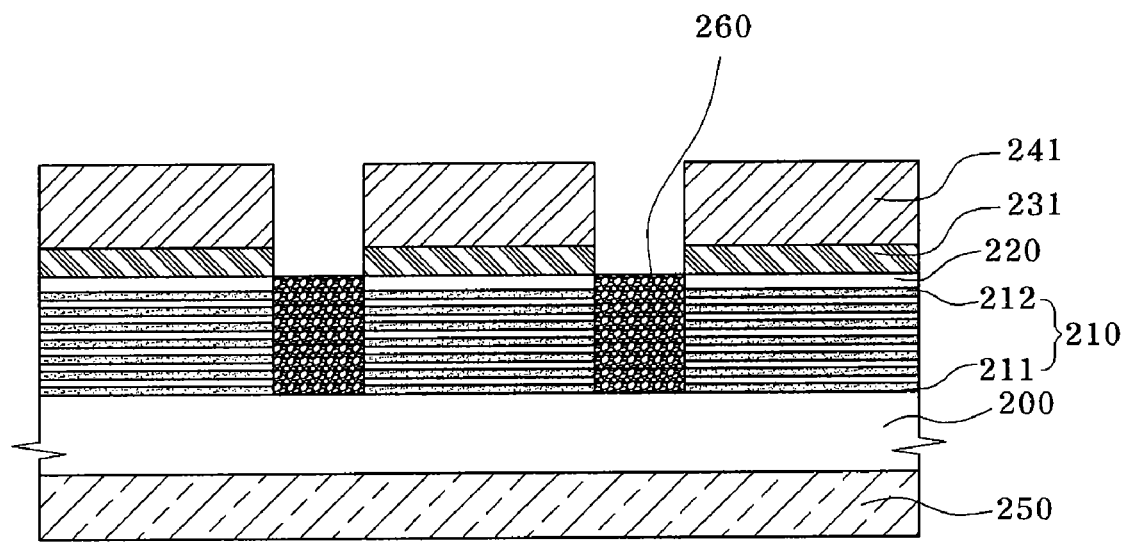
Figure 10:
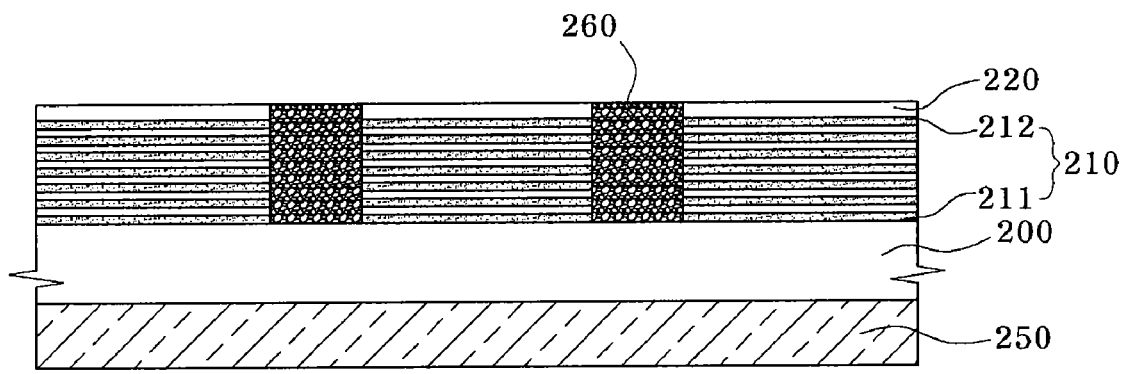

The hard mask film pattern and buffer film pattern (231 and 241 in FIG. 9) are removed. This forms the extreme ultra violet lithography mask having the structure suggested in FIG. 10.

According to another embodiment of the present invention, by selectively irradiating a laser beam to portions of the capping layer and reflective layer the lattice structure of the silicon can be change to an irregular structure. The extreme ultra violet light is canceled out and absorbed due to the irregular structure, thereby utilizing some portion of the capping layer and reflective layer as the absorption layer. Therefore, by combining the buffer layer and absorption layer into one layer a process step can be omitted. Also, it is possible to restrain the shadow effect caused by the large height difference between the buffer layer pattern and the absorption layer pattern, and thus to prevent the shift phenomenon in which a location of a wafer pattern is changed.

While the present invention has been described with respect to the specific embodiments, it will be apparent to those skilled in the art that various changes and modifications may be made without departing from the spirit and scope of the invention as defined in the following claims.

What is claimed is:
1. A method for fabricating an extreme ultra violet lithography mask, the method comprising:
  forming a reflective layer over a substrate, the reflective layer being configured to reflect an extreme ultra violet light;
  forming a capping layer comprising silicon over the reflective layer, the capping layer being configured to transmit the extreme ultra violet light;
  forming a hard mask pattern that exposes a selected portion of the capping layer;
  forming a plurality of pores in the exposed selected portion of the capping layer to form a light absorption region of the capping layer that absorbs the extreme ultra violet light; and
  removing the hard mask pattern to expose a light transmittance region of the capping layer that transmits the extreme ultra violet light.
2. The method of claim 1, wherein the reflective layer includes a plurality of molybdenum layers and a plurality of silicon layers that are alternately stacked.

3. The method of claim 1, wherein the light absorption region has a same height with the light transmittance region.

4. The method of claim 3, wherein the forming the plurality of pores in the exposed selected portion of the capping layer comprises:
   treating the exposed selected portion of the capping layer with a chemical solution including an oxidation agent and an etchant to form pores in the exposed selected portion of the capping layer.

5. The method of claim 4, wherein the chemical solution further includes a diluent, wherein the oxidation agent includes a nitric acid solution, the etchant includes a hydrofluoric acid solution and the diluent includes deionized water, wherein the capping layer is a silicon layer.

6. The method of claim 5, wherein a volume ratio of the nitric acid solution and the hydrofluoric acid solution is 49:1 to 50:1.

7. The method of claim 4, wherein the chemical solution further include a diluent and ethanol solution, wherein the oxidation agent includes a nitric acid solution, the etchant includes a hydrofluoric acid solution and the diluent includes deionized water.

8. The method of claim 7, wherein a volume ratio of the nitric acid solution and the hydrofluoric acid solution is 49:1 to 50:1 and a volume ratio of the hydrofluoric acid solution and the ethanol solution is 10:1 to 5:1.

9. An extreme ultra violet lithography mask, comprising:
   a substrate;
   a reflective layer formed over the substrate, the reflective layer being configured to reflect an extreme ultra violet light; and
   a capping layer over the reflective layer including a light transmittance region that transmits the incident extreme ultra violet light and a light absorption region having a plurality of pores that absorbs the incident extreme ultra violet light, wherein the light absorption region has a same height with the light transmittance region.

10. The extreme ultra violet lithography mask of claim 9, wherein the reflective layer includes a plurality of molybdenum layers and a plurality of silicon layers are stacked alternately.

11. The extreme ultra violet lithography mask of claim 9, wherein the capping layer is a silicon layer.

12. A method for fabricating an extreme ultra violet lithography mask, the method comprising:
   forming a reflective layer over a substrate, the reflective layer being configured to reflect an extreme ultra violet light;
   forming a capping layer comprising silicon over the reflective layer, the capping layer being configured to transmit the extreme ultra violet light;
   forming a hard mask pattern that exposes a selected portion of the capping layer;
   irradiating a laser beam to the exposed selected portion of the capping layer to change the lattice structure of the silicon from a regular structure to an irregular structure to form a light absorption region of the capping layer that absorbs the extreme ultra violet light; and
   removing the hard mask pattern to expose a light transmittance region of the capping layer that transmits the extreme ultra violet light.

13. The method of claim 12, wherein changing the lattice structure of the silicon from a regular structure to an irregular structure comprises irradiating the laser beam to the exposed portion of the capping layer so that bonding of the silicon atoms are broken by the laser beam energy at the point to which the laser beam is focused and thereby the regular structure changes to the irregular structure.

\* \* \* \* \*